Oct. 25, 1966 ERIC BUN CHIONG KHU ETAL 3,281,646
SOLID STATE FREQUENCY MULTIPLIER NETWORK IN WHICH THE INPUT AND OUTPUT CIRCUITS ARE ELECTRICALLY ISOLATED FROM EACH OTHER
Filed Nov. 29, 1962
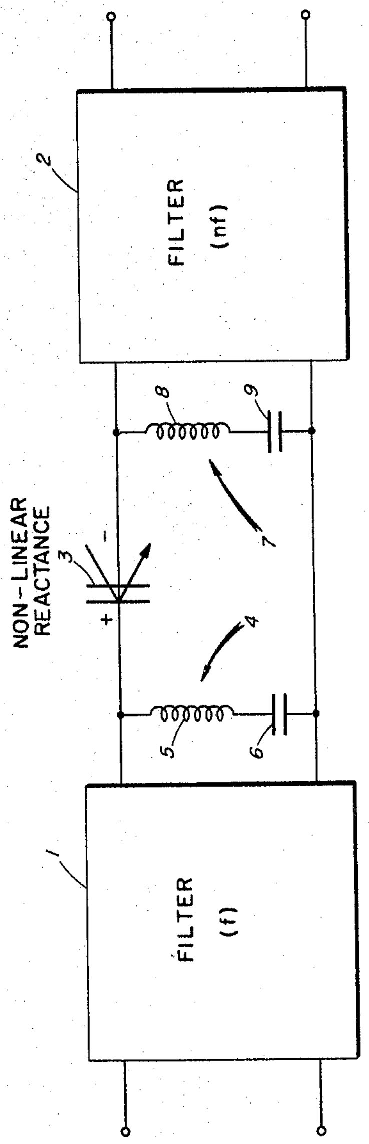
ERIC BUN CHIONG KHU
HERMAN J. BLINCHIKOFF
SAMUEL G. RUSSELL
INVENTORS
BY Claude Funkhouser
ATTORNEYS

United States Patent Office 3,281,646

Patented Oct. 25, 1966

3,281,646

SOLID STATE FREQUENCY MULTIPLIER NETWORK IN WHICH THE INPUT AND OUTPUT CIRCUITS ARE ELECTRICALLY ISOLATED FROM EACH OTHER

Eric Bun Chiong Khu, Hyattsville, Herman J. Blinchikoff, Baltimore, and Samuel G. Russell, Glen Burnie, Md., assignors to the United States of America as represented by the Secretary of the Navy Filed Nov. 29, 1962, Ser. No. 241,093
3 Claims. (Cl. 321—69)

The present invention relates in general to signal frequency generators and more particulary to an improved tuned frequency multiplier network.

The instant invention comprises an improvement in frequency multiplier networks of the type shown in U.S. Patent No. 2,443,094 to W. L. Carlson et al., issued June 8, 1948. Carlson et al. discloses a device for generating multiples of an applied fundamental frequency which utilizes a non-linear ferro-electric device as a coupling element between a fundamental resonant frequency input circuit and a harmonic resonant frequency output circuit. The principle upon which that invention is based is the non-linear variation in reactance of the ferro-electric coupling device as a function of applied potential which permits the device to be operated under certain conditions as a frequency multiplier having negligible power loss.

One problem encountered with the Carlson et al. network is a great difficulty in tuning the input and output resonant frequency circuits without incurring parasitic effects from one circuit to the other during the tuning operation. Because of the influence of the non-linear coupling device the resonant circuits must necessarily be tuned while in the network and this can only be accomplished at best by repeated tuning operations since a tuning of one resonant circuit will affect the tuning of the other.

It is therefore an object of the present invention to provide a frequency multiplier network of the type described in which the input and output circuits are electrically isolated from each other.

It is another object of the invention to provide a frequency multiplier network of the type described in which tuning of one stage may be effected without altering the tuning of another section.

It is a further object of the invention to provide a frequency multiplier of the type described which is characterized by its stability, ease of tuning, and high spurious rejection.

Other objects and many of the attendant advantages of this invention will be readily appreciated as the same becomes better understood by reference to the following detailed description when considered in connection with the accompanying drawing in which the sole figure shows a schematic circuit diagram of one embodiment of the invention.

The invention as illustrated in the drawing consists of a passive input filter circuit 1 which is tuned to be resonant at the desired input frequency $f$ and a passive output filter circuit 2 which is tuned to be resonant at a desired harmonic frequency $nf$ of the input frequency $f$. The filters 1 and 2 are designed for resistive termination at one end only and a non-linear variable reactance 3 is connected between the open circuited ends of the filters. The non-linear variable reactance 3 may be any known solid state device which produces a non-linear change in reactance with changes in applied potential.

In accordance with the principles of the invention there is provided in parallel with input filter 1 a series tuned circuit 4, consisting of an inductance 5 and a capacitance 6, which is tuned to the same harmonic frequency $nf$ to which output filter 2 is tuned. There is also provided in parallel with output filter 2 a second series tuned circuit 7, consisting of an inductance 8 and a capacitance 9, which is tuned to the input frequency $f$ to which input filter 1 is tuned. Thus, for a frequency $f$ applied to input filter 1, the series tuned circuit 4, which is tuned to frequency $nf$, will isolate the output filter 2, permitting the input filter to be tuned without affect upon the output filter. Likewise, for a frequency $nf$ applied to output filter 2, the series tuned circuit 7 which is tuned to frequency $f$ will isolate the input filter 1, permitting the output filter to be tuned without affect upon the input filter.

In tuning filter 1 to frequency $f$ the series tuned circuit 4 will appear as a capacitance and is tuned right into the input filter. In a like manner, in tuning filter 2 to frequency $nf$ the series tuned circuit 7 will appear as an inductance and is tuned right into the output filter 2. The result is that the series tuned circuits 4 and 7 merge into the filters 1 and 2, respectively, during operation of the network and the network is reduced simply to the input filter, output filter and non-linear reactance.

In addition to the inherent ease of tuning characteristic of the invention, the series tuned circuit 7 provides for added spurious rejection of frequency $f$ during operation of the network. The design of the system is also greatly simplified since the input and output filters may be designed independently of each other.

Obviously, many modifications and variations of the present invention are possible in the light of the above teachings. It is therefore to be understood that within the scope of the appended claims the invention may be practiced otherwise than as specifically described.

What is claimed is:

1. A frequency multiplying network comprising a source of input signals, a first filter connected to said signal source and tuned to the frequency of said input signals, a second filter tuned to a multiple of the frequency of said input signals, a nonlinear reactive device connecting said first filter to said second filter, and means for electrically isolating said second filter from signals of said input frequency and for electrically isolating said first filter from signals of said multiple frequency, said isolating means comprising a pair of tuned circuits each consisting of an inductor and a capacitor connected in series.

2. A frequency multiplying network comprising a source of input signals, a first filter connected to said signal source and tuned to the frequency of said input signals, a second filter tuned to a multiple of the frequency of said input signals, a non-linear reactive device connecting said first filter to said second filter, and means for electrically isolating said second filter from signals of said input frequency and for electrically isolating said first filter from signals of said multiple frequency, said isolating means comprising a first series circuit tuned to said multiple frequency and connected across said first filter and a second series circuit tuned to said source frequency and connected across said second filter.

3. A frequency multiplying network comprising a source of input signals, a first filter connected to said signal source and tuned to the frequency of said input signals, a second filter tuned to a multiple of the frequency of said input signals, a non-linear reactive device connecting said first filter to said second filter, and first and second tuned circuits each consisting of an inductor and a capacitor connected in series, said first series tuned circuit being resonant at said multiple frequency and connected across said first filter and said second series tuned circuit being resonant at said source frequency and connected across said second filter so that said first and second filters are electrically isolated from each other at their own resonant frequencies.

References Cited by the Examiner

UNITED STATES PATENTS

| | | | |
|---|---|---|---|
| 1,925,520 | 9/1933 | Buschbeck | 321—65 |
| 3,025,448 | 3/1962 | Muchmore | 321—69 |
| 3,046,410 | 7/1962 | Robinson | 307—11 |
| 3,085,205 | 4/1963 | Sante | 321—69 |
| 3,196,339 | 7/1965 | Walker et al. | 321—69 |

FOREIGN PATENTS

| | | |
|---|---|---|
| 982,065 | 2/1965 | Great Britain. |

JOHN F. COUCH, *Primary Examiner.*

LLOYD McCOLLUM, *Examiner.*

J. J. KISSANE, G. GOLDBERG, *Assistant Examiners.*